United States Patent [19]

Kelley

[11] Patent Number: 4,533,192

[45] Date of Patent: Aug. 6, 1985

[54] INTEGRATED CIRCUIT TEST SOCKET

[75] Inventor: Lewis J. Kelley, Grapevine, Tex.

[73] Assignee: Minnesota Mining and Manufacturing Company, St. Paul, Minn.

[21] Appl. No.: 603,616

[22] Filed: Apr. 25, 1984

[51] Int. Cl.³ .................. H01R 13/627; H01R 13/635
[52] U.S. Cl. ............... 339/45 M; 339/17 CF; 339/74 R; 339/75 MP
[58] Field of Search ............ 339/17 CF, 74 R, 75 M, 339/75 MP, 176 M, 176 MP, 45 R, 45 M, 46

[56] References Cited

U.S. PATENT DOCUMENTS

| 2,986,612 | 5/1961 | Healy | 339/45 R |
| 4,018,494 | 4/1977 | Scheingold et al. | 339/17 CF |
| 4,222,622 | 9/1980 | Griffin et al. | 339/17 CF |
| 4,420,207 | 12/1983 | Nishikawa | 339/17 CF |

FOREIGN PATENT DOCUMENTS 2119173  11/1983  United Kingdom ........... 339/17 CF

OTHER PUBLICATIONS

Locknest Specifications, "Surface Mount Sockets", C. K. Wall Company, Inc.
Textool, Chip Carrier Sockets, Textool Products.

Primary Examiner—John McQuade
Attorney, Agent, or Firm—Donald M. Sell; James A. Smith; Terryl K. Qualey

[57] ABSTRACT

A test socket for integrated circuits in rectangular packages having contact pads or leads. The test socket has an insulating body with a top opening into which a package may be inserted and latched in place by electrical contact elements that also make electrical connection to the pads or leads on the package. After the integrated circuit has been tested the package may be removed from the test socket by depressing it past the latching position to cause an unlatching cam to move the contact elements to an unlatching position and a resiliently loaded ejector member to thereafter carry the package past the latching position and out of the test socket.

10 Claims, 6 Drawing Figures

INTEGRATED CIRCUIT TEST SOCKET

FIELD OF THE INVENTION

The present invention relates to a test socket for integrated circuits in rectangular packages having contact pads or leads.

BACKGROUND OF THE INVENTION

Critical integrated circuits are tested at elevated temperatures before being installed in a product because it has been found that a vast majority of those circuits subject to failure will fail in a very short test period. These integrated circuits are frequently put in rectangular ceramic or plastic packages that have contact pads or leads, which pads or leads are electrically connected to the integrated circuit. To test the integrated circuit it is necessary to make temporary electrical connections to the contact pads or leads on the integrated circuit package. Test sockets which may be soldered to printed circuit boards having the appropriate circuitry for testing a particular integrated circuit have been provided for this purpose.

Chip carrier test sockets currently sold by Minnesota Mining and Manufacturing Company, St. Paul, Minn., the assignee of the present invention, under the Textool trademark have contact elements that make electrical contact to pads on the base of the integrated circuit package. Those sockets have covers hinged on bodies that carry the contact elements, which covers latch to the body and have a pressure pad to force the pads on the package against the contact elements. A second socket sold by Plastronics Inc. of Irving, Tex. under the trademark Lock-Nest has a top opening into which the package is inserted and contacts to make electrical connection to leads along the sides of the package. The package is released by turning the socket, and the printed circuit board to which many sockets may be soldered, upside down and pressing down on the cover of the socket to let the package fall out. A third socket, known as the NEY socket, like the Lock-Nest socket, has a top opening into which the package is inserted and contacts to make electrical connection to leads along the sides of the package. However, the NEY socket has an ejection mechanism much like in many ball point pens. The package, when inserted into the top opening, is placed on a plunger and then pressed down until the plunger locks in the depressed test position and the pressure is then released. Pressing on the package a second time releases the plunger which then moves upward carrying the package out of the socket. Each of these designs is limited in its utility since it can only be constructed to test packages with pads on their bases or packages with leads along their edges.

SUMMARY OF THE INVENTION

The present invention provides a test socket for integrated circuits in rectangular packages having contact pads or leads. It has an insulating body with a base wall, side walls and a top opening through which the integrated circuit package may be inserted into the body. A plurality of electrical contact elements are retained in the body, one for each contact pad or leads to be test connected on the integrated circuit package. Each contact element has a resilient contact leg extending in a direction from the base wall of the body toward the top opening and has its free end adjacent the top opening. Each contact leg is formed with an electrical contact portion and a latching projection adjacent its free end and extending generally perpendicular to the length of the leg toward the interior of the insulating body. The contact elements are mounted in the body such that when an integrated circuit package is inserted into the top opening in the insulating body and pressed downward toward the body base wall its periphery contacts the contact element legs adjacent their free ends and forces them outwards until the base of the package passes the latching projections on the legs whereupon the resiliency of the legs causes them to move inward to move the latching projections into their latching positions over the outward facing surface of the package. The inward movement of the legs also brings electrical contact portions on the legs into contact with the pads or leads on the package. An unlatching cam in the body has a rest position permitting the resilient contact legs to position the latching projections in their latching positions. The cam is movable toward the body base wall to an unlatching position to force the contact legs outward to move the latching projections outward beyond the periphery of the package. An ejector member is formed with an integrated circuit package support surface that is accessible through the top opening in the body to receive and support the integrated circuit package when the ejector member is in an unloaded position adjacent the top opening. The ejector member is movable from the unloaded position toward the body base wall to permit the package to be moved past the latching projections on the contact legs to cause the package to be latched into the test socket, and it is movable beyond the latched position to permit the package to contact the unlatching cam to move it toward the base wall to its unlatching position. A resilient member urges the ejector member toward its unloaded position adjacent the top opening in the body.

THE DRAWING

DESCRIPTION OF THE PREFERRED EMBODIMENT

Figure 1:
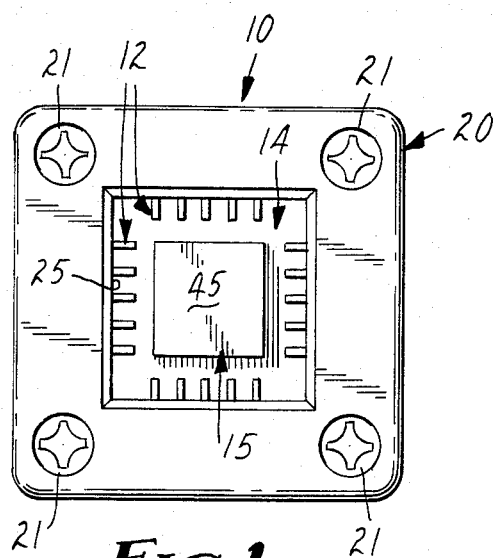
FIG. 1 is a top view of an integrated circuit test socket constructed in accordance with the present invention.

The test socket of the present invention has an insulating body 10, a plurality of electrical contact elements 12, an unlatching cam 14, an ejector member 15 and a resilient ejector spring 17.

The insulating body 10 is formed of a base 19 and a cover 20 held together by screws 21. The base 19 and cover 20 together provide the insulating body 10 with a base wall 23, side walls 24 and a top opening 25. The top opening 25 is of the same shape and of slightly larger dimensions than the integrated circuit package 27 to be tested. The illustrated embodiment is designed to test square integrated circuit packages 27 that have five contact pads 28 along each edge on the base of the package.

Each of the contact elements 12 has an upper section that is symmetrical about a center-line and consists of two cantilevered resilient contact legs 29 and a lower solder tail 30. The contact elements 12 are supported in the insulating body 10 with their solder tails 30 extending through apertures in the base wall 23, adjacent contact elements alternating between having their contact tails inward of the center-line of the contact elements toward the center of the body and then outward toward the edge of the body to increase the spacing between adjacent solder tails 30. The contact elements 12 are made with an upper section symmetrical about a center-line so that the identical contact elements can be used in adjacent positions. The innermost contact leg 29 of each contact element 12 is the active contact leg. It extends in a direction from the base wall 23 of the body toward the top opening 25 and has its free end adjacent the top opening. Each contact leg 29 is formed with a latching projection 32 adjacent its free end and extending generally perpendicular to the length of the leg toward the interior of the insulating body. From the latching projection 32 to the free end of the contact leg 29 the contact leg is tapered toward the outside of the body to form a camming surface 33 for engagement by the edge of the integrated circuit package 27. Immediately below the latching projection 32 the contact leg 29 is slightly tapered inward to form a minor inward projection 35 for making contact to an electrically conductive area along the side of an integrated circuit package known as a castilated package. Midway of its length, each contact leg 29 is formed with a second camming surface 37 sloping inward of the body toward the base wall 23 and terminating in a rounder cam latch projection 38.

Figure 2:
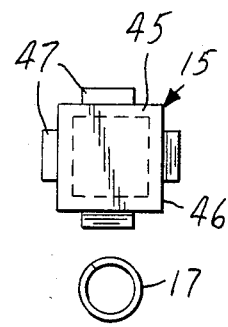
FIG. 2 is an elevation view of the test socket, with portions broken away to show the interior of the test socket.
Figure 2:
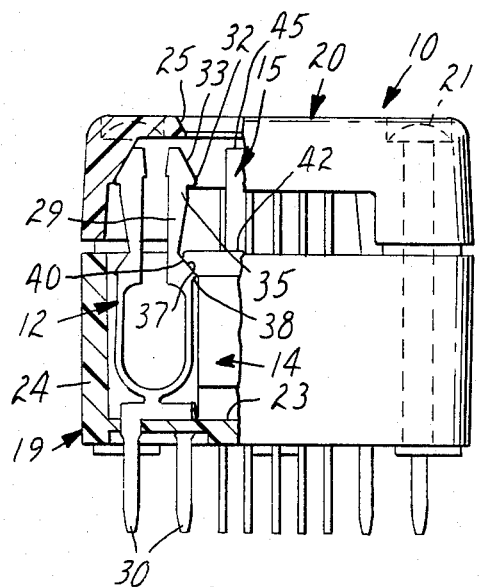
Figure 3:
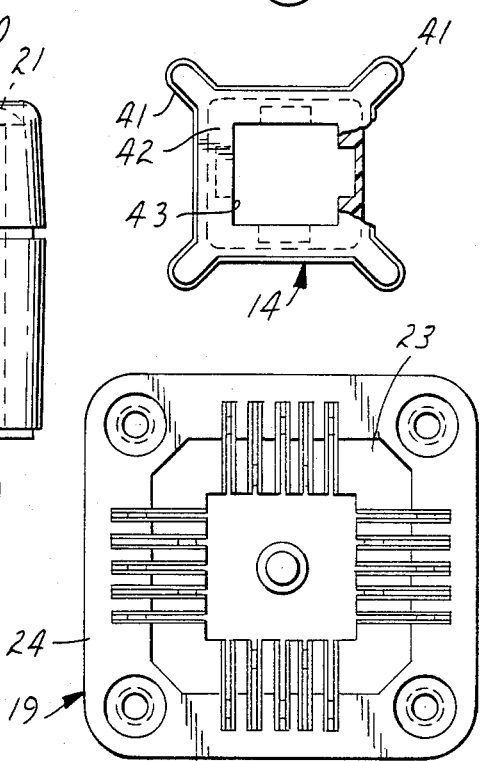
FIG. 3 is an exploded view of the test socket without the cover or the contact elements.

The unlatching cam 14 is generally square in top view and has cam surfaces 40 along each of its edges complementary to the second camming surface 37 on the contact legs 29. In the rest position of the unlatching cam, illustrated in FIG. 2, its cam surfaces 40 rest on the second camming surfaces 37 of the contact legs 29 permitting the resilient contact legs 29 to position the latching projections 32 in their latching positions. The unlatching cam 14 is formed with projections 41 at its corners that contact the bottom of the body cover 20 in the rest position of the unlatching cam 14 to prevent the unlatching cam from moving farther from the body base wall 23. The body of the unlatching cam 14 is elongate and hollow and its top surface 42 is formed with a central aperture 43 in which the ejector member 15 is telescopically received. When the unlatching cam is pressed downward toward the body base wall 23 its cam surfaces 40 slide along the camming surfaces 37 on the contact legs 29 until the end of the unlatching cam surfaces 40 pass the cam latch projections 38 on the cam contact legs 29. This camming action causes the contact legs 29 to be deflected outward to move their latching projections 32 beyond the periphery of the integrated circuit package 27 (see FIG. 5). The length of the body of the unlatching cam 14 is chosen so that the unlatching cam can only be pressed a short distance beyond the cam latch projections 38 before the lower end of the unlatching cam contacts the body base wall 23 and prevents further movement.

The ejector member 15 is square in top view and hat shaped in elevation with a top integrated circuit package support surface 45. The body 46 of the ejector member 15 just fits through the central aperture 43 in the top surface 42 of the unlatching cam 14 so that its brim 47, which consists of a segment along each side of the body, will engage the inner surface of the unlatching cam 14 around the periphery of the aperture 43 when the ejector member 15 is fully telescoped outward away from the body base wall 23.

The illustrated ejector spring 17 is a helical wound compression spring. It is captured between the body base wall 23 and the top of the ejector member 15 to urge the ejector member away from the body base wall to its unloaded position illustrated n FIG. 2 with its brim 46 engaging the inner surface of the unlatching cam 14. The engagement of the brim of the ejector member 15 with the unlatching cam 14 and the unlatching cam corner projections 41 with the bottom of the cover 20 prevents the spring 17 from pushing the ejector member 15 outward beyond its unloaded position illustrated in FIG. 2.

Figure 4:
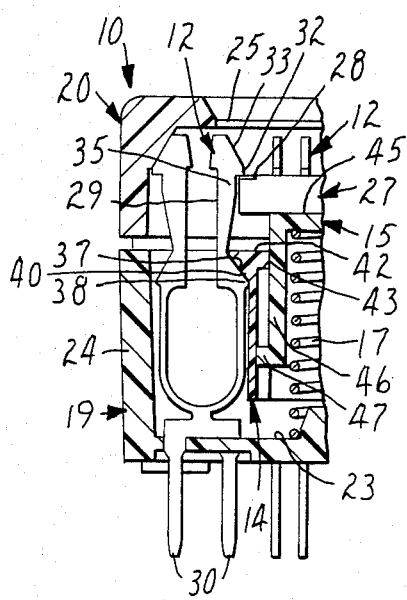
FIG. 4 is a partial elevation view similar to that of FIG. 2 with an integrated circuit package latched into the test socket.

In use, the test socket is placed on a printed circuit board having the appropriate test circuitry thereon with the solder tails 30 of the contact elements 12 extending through holes in the printed circuit board, and the tails are soldered in place. An integrated circuit package 27 to be tested is held face down and inserted through the top opening 25 onto the integrated circuit package support surface 45 of the ejector member 15. The package is then pressed downward toward the body base wall 23 causing its peripheral edges to engage the first camming surfaces 33 on the contact legs 29 and deflect the contact legs outward. When the package 27 is pressed past the latching projections 32 on the contact legs 29, the resiliency of the legs causes them to move inward to position the latching projections 32 over the outward facing surface of the package and, with the illustrated package 27, over the contact pads 28 on the base of the package. Releasing the pressure on the package at this point permits the ejector spring to force the ejector member 15 and the package thereon upward to bring the contact pads 28 into contact with the latching projections 32 as illustrated in FIG. 4. This latches the package into the test socket and makes the electrical connections to the contact pads 28 for testing. The minor projections 35 on the contact legs 29 will contact the sides of the package 27 and, if the package is of the type that has conductive leads extending along its sides, electrical connection will also be made there. Thus, in the illustrated embodiment, the latching projections 32 and minor projections 35 define electrical contact portions on the resilient contact legs 29.

Figure 5:
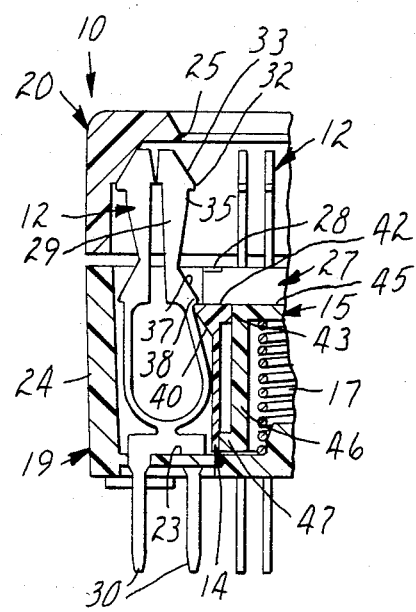
FIG. 5 is a view like that of FIG. 4 with the package depressed to the unlatching position.
Figure 6:
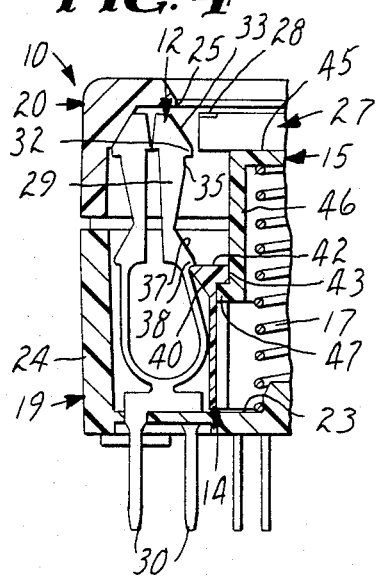
FIG. 6 is a view like that of FIGS. 4 and 5 with the package released and moved past the latching position in the process of being removed from the test socket.

After the integrated circuit has been tested it can be easily removed from the test socket. This is accomplished by again pushing down on the package. However, this time the package is pushed down as far as it can be pushed. During this movement the ejector member 15 is fully telescoped into the unlatching cam 14. The package then contacts the top surface 42 of the cam and forces the cam downward until the lower end of the cam contacts the body base all 23, stopping further downward movement of the package. Movement of the unlatching cam downward causes its cam surfaces 40 to slide along the second camming surfaces 37 on the contact legs 29 forcing them outward. When the end of the latching cam surfaces 40 pass beyond the cam latch projections 38 on the contact legs 29 the unlatching cam 14 is in its unlatching position and the latching projections 32 on the contact legs 29 are positioned beyond the periphery of the integrated circuit package 27. The cam latch projections 38 cause the unlatching cam to be temporarily resiliently latched in its unlatching position as illustrated in FIG. 5. Removal of the pressure on the package will then cause the ejector member 15 to be moved upward away from the body base wall 23 by the ejector spring 17. After the ejector member 15 has carried the package 27 upward beyond the position where it can be engaged by the latching projections 32 (see FIG. 6), the brim parts 47 of the ejector member engage the inner surface of the unlatching cam then carry it past the cam latch projections 38 and back to its rest position illustrated in FIG. 2. The package 27 may then be picked up off the support surface 45 of he ejector member 15.

In specific embodiments, the insulating body 10, unlatching cam 14 and ejector member 15 of test sockets made in accordance with the invention are preferrably made of General Electric's Ultem 2300, a glass reinforced polyetherimide, for tests up to 170° C. For temperatures from 170° C. to 200° C., Ryton R4, a polyphenylene sulfide from Philips Petroleum, is preferred. The contact elements 12 are preferrably made of beryllium-nickel or beryllium-copper.

I claim:

1. A test socket for integrated circuits in rectangular packages having contact pads or leads comprising:
an insulating body having a base wall, side walls and a top opening through which a said integrated circuit package may be inserted into said body,
a plurality of electrical contact elements in said body, one for each contact pad or lead to be test connected on a said integrated circuit package, each said contact element having a resilient contact leg extending in a direction from said base wall of said body toward said top opening and having its free end adjacent said top opening, each said contact leg being formed with an electrical contact portion and a latching projection adjacent its free end and extending generally perpendicular to the length of said leg toward the interior of said insulating body, said contact elements being mounted in said body such that when a said integrated circuit package is inserted into said top opening in said insulating body and pressed downward toward said body base wall its periphery contacts said contact element legs adjacent their free ends and forces them outwards until the base of said package passes said projections whereupon the resiliency of said legs causes them to move inward to bring said latching projections into contact latching positions over the outward facing surface of the package and said electrical contact portions of said legs into contact with the pads or leads on the package,
an unlatching cam in said insulating body, said unlatching cam having a rest position permitting said resilient contact legs to position said latching projections in their latching positions and being movable toward said body base wall to an unlatching position to force said contact legs outward to move the latching projections outward beyond the periphery of the package,
an ejector member in said insulating body, said ejector member being formed with an integrated circuit package support surface that is accessible through said top opening in said body to receive and support a said integrated circuit package when said ejector member is in an unloaded position adjacent said top opening, said ejector member being movable from said unloaded position toward said body base wall to permit the package to be moved past said latching projections on said contact legs to cause the package to be latched into the test socket and being movable beyond the latched position to permit the package to contact said unlatching cam to move it toward said base wall to its unlatching position, and
resilient means urging said ejector member toward its unloaded position.

2. The test socket of claim 1 for integrated circuits in packages having contact pads on their bases wherein said electrical contact portions of said contact legs comprise said latching projections.

3. The test socket of claim 2 wherein each contact leg is formed to make contact to an electrically conductive area along the side of said integrated circuit package.

4. The test socket of claim 1 including temporary latching means for temporarily resiliently latching said unlatching cam in said unlatching position to permit said ejector member under the force of said resilient means to carry a said integrated circuit package past said latching projections before they are permitted to move back to their latching positions and wherein said ejector member engages said unlatching cam and moves it past said temporary latching means and to its rest position after the package has been ejected.

5. The test socket of claim 4 wherein said temporary latching means comprises a protrusion on each of said contact element legs.

6. The test socket of claim 1 wherein at least one stop is provided to prevent said unlatching cam from moving away from said body base wall farther than said rest position and wherein said ejector member engages said unlatching cam when both are in their rest positions to prevent said resilient means from moving said ejector member farther from said body base wall than its unloaded position and said ejector member is movable toward said body base wall independent of said unlatching cam.

7. The test socket of claim 6 wherein said unlatching cam has a central aperture and said ejector member extends through said central aperture and telescopes into said unlatching cam when a said integrated circuit package is placed on its support surface and pressed downward toward said body base wall.

8. The test socket of claim 1 wherein there are a plurality of said contact elements arranged to make contact to contact pads along each edge of said integrated circuit package.

9. The test socket of claim 8 wherein there are the same number of said contact elements for each edge of a said integrated circuit package.

10. The test socket of claim 1 wherein each contact leg is formed to make contact to an electrically conductive area along the side of a said integrated circuit package.

* * * * *